(12) United States Patent
Moore et al.

(10) Patent No.: US 6,194,321 B1
(45) Date of Patent: Feb. 27, 2001

(54) SEMICONDUCTOR PROCESSING METHODS UTILIZING BORON AND NITROGEN, AND SEMICONDUCTOR WAFERS COMPRISING BORON AND NITROGEN

(75) Inventors: John T. Moore; Scott Jeffrey DeBoer, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/136,882

(22) Filed: Aug. 19, 1998

(51) Int. Cl.$^7$ .................................................. H01L 21/3065
(52) U.S. Cl. .................... 438/706; 438/708; 438/710; 438/711; 438/716; 438/717
(58) Field of Search ..................... 438/421, 706, 438/717, 710, 716, 708, 711; 216/67, 12; 257/513, 437, 629, 647; 356/4.01

(56) References Cited

U.S. PATENT DOCUMENTS

| | | | |
|---|---|---|---|
| 4,253,029 | * | 2/1981 | Lepselter et al. ................. 378/35 |
| 4,614,433 | * | 9/1986 | Feldman et al. .................. 356/401 |
| 4,696,878 | * | 9/1987 | Shimkunas ....................... 430/5 |
| 4,957,773 | * | 9/1990 | Spencer et al. .................. 427/570 |
| 5,005,075 | * | 4/1991 | Kobayashi et al. ............... 378/35 |
| 5,066,533 | * | 11/1991 | America et al. .................. 428/156 |
| 5,168,343 | * | 12/1992 | Sakamoto ........................ 257/513 |
| 5,217,567 | * | 6/1993 | Cote et al. ..................... 216/67 |
| 5,413,966 | * | 5/1995 | Schoenborn ...................... 438/421 |
| 5,575,929 | * | 11/1996 | Yu et al. ........................ 216/10 |
| 5,821,169 | * | 10/1998 | Nguyen et al. ................... 438/736 |
| 5,858,870 | * | 1/1999 | Zheng et al. .................... 438/622 |

\* cited by examiner

*Primary Examiner*—Benjamin L. Utech
*Assistant Examiner*—Binh X Tran
(74) *Attorney, Agent, or Firm*—Wells, St. John, Roberts, Gregory & Matkin

(57) ABSTRACT

In one aspect, the invention includes a semiconductor processing method comprising: a) forming a layer comprising boron and nitrogen over a substrate; b) forming a photoresist over the layer comprising boron and nitrogen; and c) exposing one or more portions of the photoresist to light to pattern the photoresist. In another aspect, the invention includes a semiconductor processing method comprising: a) forming a layer comprising boron nitride over a substrate; b) forming a layer of photoresist over the layer comprising boron nitride; c) exposing portions of the photoresist to light while leaving other portions of the photoresist unexposed, some light passing through the photoresist during the exposing; d) absorbing light passing through the photoresist with the layer comprising boron nitride; and e) selectively removing either the exposed or unexposed portions of the photoresist while leaving the other of the exposed and unexposed portions over the substrate to pattern the photoresist. In yet another aspect, the invention includes a semiconductor wafer construction comprising: a) a semiconductive material substrate; b) a layer comprising boron and nitrogen supported by the substrate; and c) a photoresist layer over the layer comprising boron and nitrogen.

22 Claims, 3 Drawing Sheets

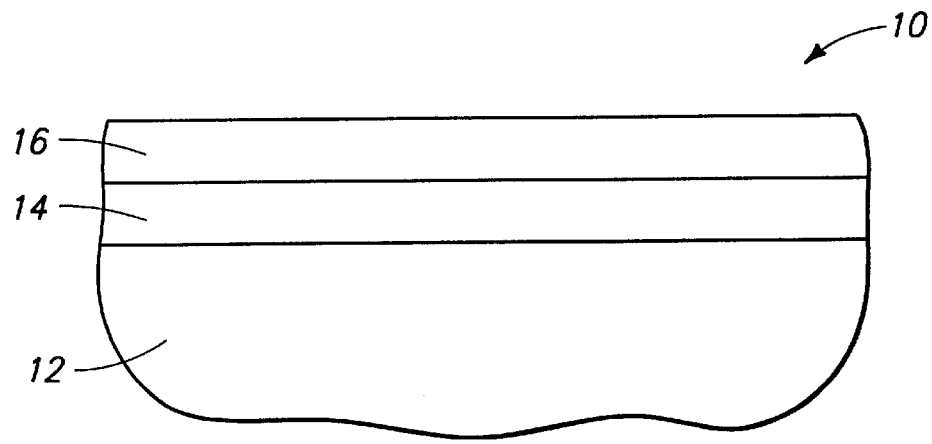
_FIG 1_
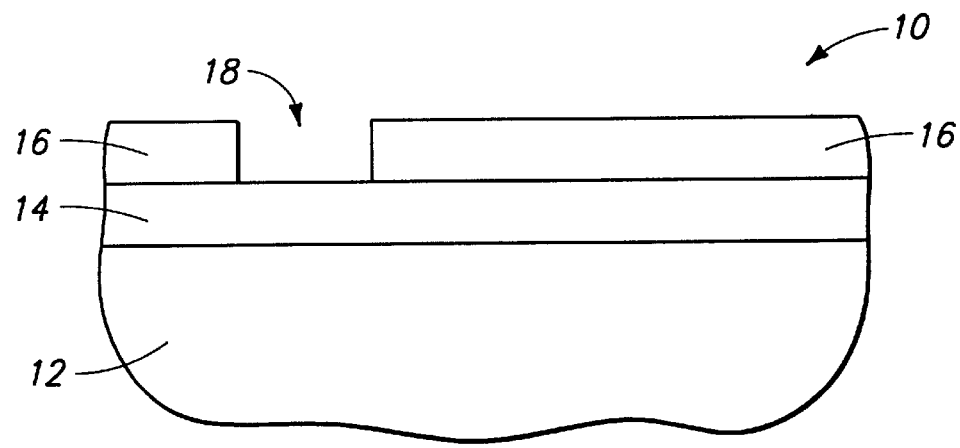
_FIG 2_
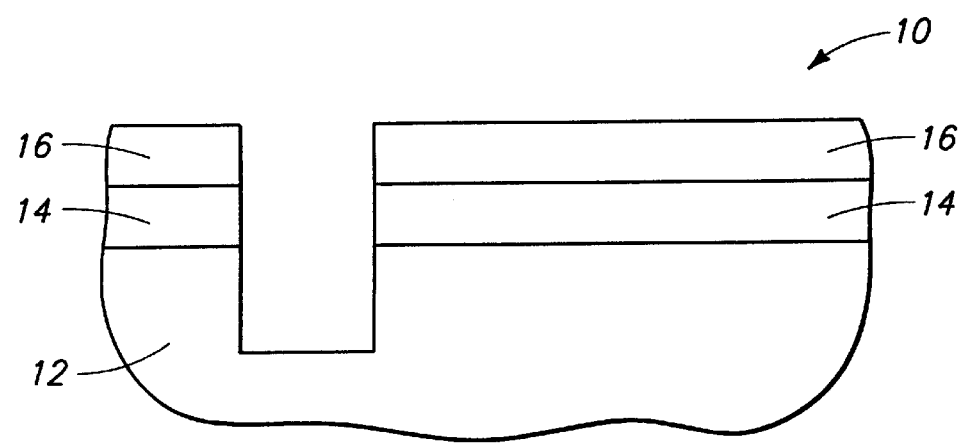
_FIG 3_

SEMICONDUCTOR PROCESSING METHODS UTILIZING BORON AND NITROGEN, AND SEMICONDUCTOR WAFERS COMPRISING BORON AND NITROGEN

TECHNICAL FIELD

The invention pertains to semiconductor processing methods, such as, for example, methods of patterning photoresist in which an antireflective material is utilized to attenuate (for example, absorb) radiation. The invention also pertains to semiconductive wafer structures.

BACKGROUND OF THE INVENTION

Semiconductor processing frequently involves providing a photoresist layer over a substrate. Portions of the photoresist layer are subsequently exposed to light through a masked light source. The mask contains clear and opaque features defining a pattern to be created in the photoresist layer. Regions of the photoresist layer which are exposed to light are made either soluble or insoluble in a solvent. If the exposed regions are soluble, a positive image of the mask is produced in the photoresist. The photoresist is therefore termed a positive photoresist. On the other hand, if the non-irradiated regions are dissolved by the solvent, a negative image results. Hence, the photoresist is referred to as a negative photoresist.

A difficulty that can occur when exposing photoresist to radiation is that waves of radiation can propagate through the photoresist to a layer beneath the photoresist and then be reflected back up through the photoresist to interact with other waves propagating through the photoresist. The reflected waves can constructively and/or destructively interfere with other waves propagating through the photoresist to create periodic variations of light intensity within the photoresist. Such variations of light intensity can cause the photoresist to receive non-uniform doses of energy throughout its thickness. The non-uniform doses can decrease the accuracy and precision with which a masked pattern is transferred to the photoresist. Also, the radiated waves reflected back from a non-flat surface underlying photoresist can enter portions of the photoresist that are not supposed to be exposed. Accordingly, it is desired to develop methods which suppress radiation waves from being reflected by layers beneath a photoresist layer.

A method which has been used with some success to suppress reflected waves is to form an antireflective coating beneath a photoresist layer. Antireflective coatings can, for example, comprise materials which absorb radiation, and which therefore quench reflection of the radiation. Antireflective coatings absorb various wavelengths of radiation with varying effectiveness. The wavelengths absorbed, and the effectiveness with which they are absorbed, vary depending on the materials utilized. It would be desirable to develop additional materials for use as antireflective coatings.

SUMMARY OF THE INVENTION

In one aspect, the invention encompasses a semiconductor processing method wherein a layer comprising boron and nitrogen is formed over a substrate. A photoresist is formed over the layer comprising boron and nitrogen. One or more portions of the photoresist is exposed to light to pattern the photoresist.

In another aspect, the invention encompasses a semiconductor processing method wherein a layer comprising boron nitride is formed over a substrate. A layer of photoresist is formed over the layer comprising boron nitride. Portions of the photoresist are exposed to light while leaving other portions of the photoresist unexposed. Some of the light passes through the photoresist during the exposing. Light passing through the photoresist is absorbed with the layer comprising boron nitride. Either the exposed or unexposed portions of the photoresist are removed while leaving the other of the exposed and unexposed portions over the substrate to pattern the photoresist.

In yet another aspect, the invention encompasses a semiconductor wafer construction. The construction includes a layer comprising boron and nitrogen supported by a semiconductor substrate, and a photoresist layer over the layer comprising boron and nitrogen.

BRIEF DESCRIPTION OF THE DRAWINGS

Preferred embodiments of the invention are described below with reference to the following accompanying drawings.

FIG. 1 is a fragmentary, diagrammatic, cross-sectional view of a semiconductor wafer fragment at a preliminary processing step of a method of the present invention.

FIG. 2 is a view of the FIG. 1 wafer fragment at a processing step subsequent to that shown in FIG. 1.

FIG. 3 is a view of the FIG. 1 wafer fragment at a processing step subsequent to that shown in FIG. 2.

DETAILED DESCRIPTION OF THE PREFERRED EMBODIMENTS

Figure 4:
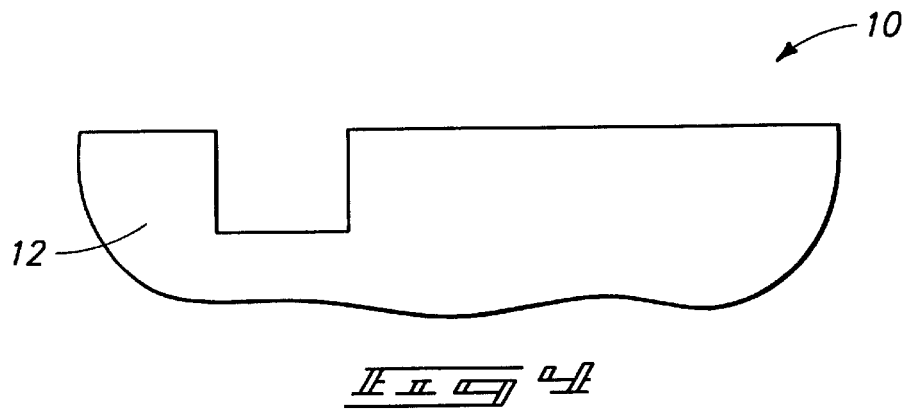
FIG. 4 is a view of the FIG. 1 wafer fragment at a processing step subsequent to that shown in FIG. 3.

This disclosure of the invention is submitted in furtherance of the constitutional purposes of the U.S. Patent Laws "to promote the progress of science and useful arts" (Article 1, Section 8).

A first embodiment method of the present invention is described with reference to FIGS. 1–4. Referring to FIG. 1, a semiconductor wafer fragment 10 is illustrated at a preliminary processing step. Wafer fragment 10 comprises a substrate 12, an overlying antireflective material layer 14, and a photoresist layer 16 over the antireflective material layer 14. The substrate can comprise, for example, a monocrystalline silicon wafer lightly doped with a conductivity-enhancing dopant. To aid in interpretation of this disclosure and the claims that follow, the term "semiconductive substrate" is defined to mean any construction comprising semiconductive material, including, but not limited to, bulk semiconductive materials such as a semiconductive wafer, either alone or in assemblies comprising other materials thereon, and semiconductive material layers (either alone or in assemblies comprising other materials). The term "substrate" refers to any supporting structure, including, but not limited to, the semiconductive substrates described above.

Antireflective material layer 14 can comprise boron and nitrogen. Specifically, antireflective material layer 14 can comprise boron nitride (BN), and can predominately comprise boron nitride (i.e., comprise more than 50%, by weight, boron nitride). Preferably, antireflective material 14 consists essentially of boron and nitrogen, and more preferably consists essentially of boron nitride.

Antireflective material layer 14 can be formed by, for example, low pressure chemical vapor deposition utilizing a boron precursor in combination with ammonia. The boron precursor can comprise, for example, at least one of tetraethylborate or diborane. Preferably, the ammonia is provided in a greater concentration than the boron precursor. For instance, a weight ratio of the ammonia to the boron precursor can be from about 5:1 to about 100:1. The ammonia and boron precursor can be provided in the low pressure chemical vapor deposition reactor by bubbling $N_2$ as a carrier gas, through liquid volumes of the ammonia and the boron precursor. Alternatively, the ammonia and boron precursors can be provided in the chemical vapor deposition reactor by vaporizing liquids to form gaseous ammonia and gaseous boron precursors. Deposition of material 14 can occur with a plasma being present in the chemical vapor deposition apparatus, or can occur without such plasma.

A temperature within a chemical vapor deposition reactor during deposition of layer 14 can be, for example, from about 350° C. to about 550° C., but is preferably less than about 400° C. Specifically, temperatures below 400° C. can be advantageous in applications in which metal layers are exposed to reactive conditions during deposition of layer 14 as temperatures above 400° C. can result in degradation of the metal layers, including spikes or hillock formation, for example.

An exemplary pressure utilized during deposition of a boron nitride antireflective layer 14 in a low pressure chemical vapor deposition reactor is from about 10 mTorr to about 2000 mTorr.

Photoresist layer 16 can comprise either a negative photoresist or a positive photoresist. In the shown embodiment, photoresist layer 16 is provided on (i.e., against) antireflective material 14.

Referring to FIG. 2, photoresist layer 16 is patterned by exposing the layer to a patterned beam of radiation (i.e., light). Such patterning can comprise conventional methods such as the negative photoresist processing or positive photoresist processing described in the "Background" section of this disclosure. Portions of photoresist layer 16 that are exposed to the radiation will behave differently in the solvent than will portions of unexposed radiation. Either the portions exposed to radiation or the portions unexposed to radiation are removed from over substrate 12 to leave the other of the portions exposed to radiation or unexposed to radiation remaining over substrate 12. Whether it is the portions that are exposed to radiation which are removed or the portions that are unexposed to radiation which are removed will depend on whether photoresist layer 16 comprises a negative or positive photoresist. The removal of a portion of photoresist layer 16 forms an opening 18 through photoresist layer 16. After formation of opening 18, photoresist layer 16 becomes a patterned mask. A portion of antireflective material layer 14 is covered by patterned mask 16, and a portion is exposed through opening 18.

During the exposure of photoresist layer 16 to radiation, some of the radiation penetrates through layer 16 and into antireflective material layer 14. Antireflective material layer 14 attenuates, and preferably absorbs such penetrating radiation waves. Specifically, it is observed that an antireflective material layer 14 consisting essentially of boron nitride can effectively attenuate radiation having a wavelength of from about 200 nanometers to about 400 nanometers. The effectiveness with which a boron nitride comprising layer 14 absorbs radiation can be influenced by a thickness of the layer as well as its composition. It is found that boron nitride layers having thicknesses of from about 100 Angstroms to about 4000 Angstroms can absorb nearly 100% of the light having a wavelength of from about 200 nanometers to about 400 nanometers that enters such materials. (Specifically, the boron nitride layers absorb greater than about 97% of the light entering the layers.) An exemplary thickness of a boron nitride layer 14 is about 300 Angstroms.

Referring to FIG. 3, opening 18 is extended through antireflective material layer 14 and into substrate 12. Opening 18 can be extended by, for example, a dry plasma etch.

Referring to FIG. 4, photoresist layer 16 and antireflective material layer 14 are removed from over substrate 12. In embodiments in which antireflective material layer 14 consists essentially of boron nitride, layers 16 and 14 can be removed in a same etch utilizing a common etchant. Such common etchant can comprise, for example, $CF_4$ and $O_2$.

Figure 5:
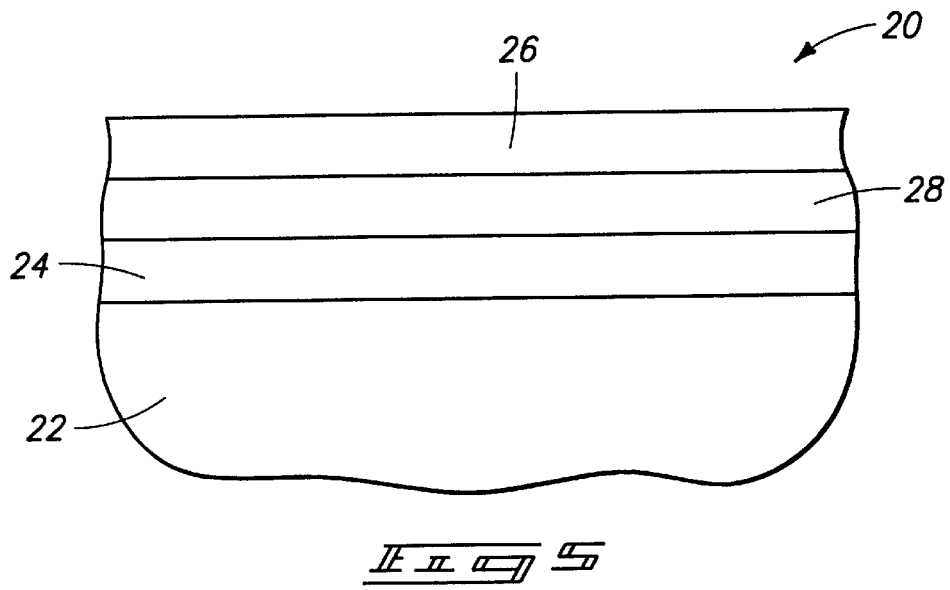
FIG. 5 is a fragmentary, diagrammatic, cross-sectional view of a semiconductor wafer fragment at a preliminary processing step of a second embodiment method of the present invention.

A second embodiment of the present invention is described with reference to FIGS. 5–8. Referring to FIG. 5, a semiconductor wafer fragment 20 is illustrated at a preliminary processing step. Wafer fragment 20 comprises a substrate 22, an overlying antireflective material layer 24, a photoresist layer 26, and a layer 28 separating antireflective layer 24 from photoresist layer 26. Substrate 22 can comprise materials discussed above regarding substrate 12 of FIGS. 1–4, and layers 24 and 26 can comprise materials of layers 14 and 16, respectively, discussed above with reference to FIGS. 1–4. Intervening layer 28 comprises a material that is at least somewhat transparent to light utilized during patterning of photoresist layer 26.

Figure 6:
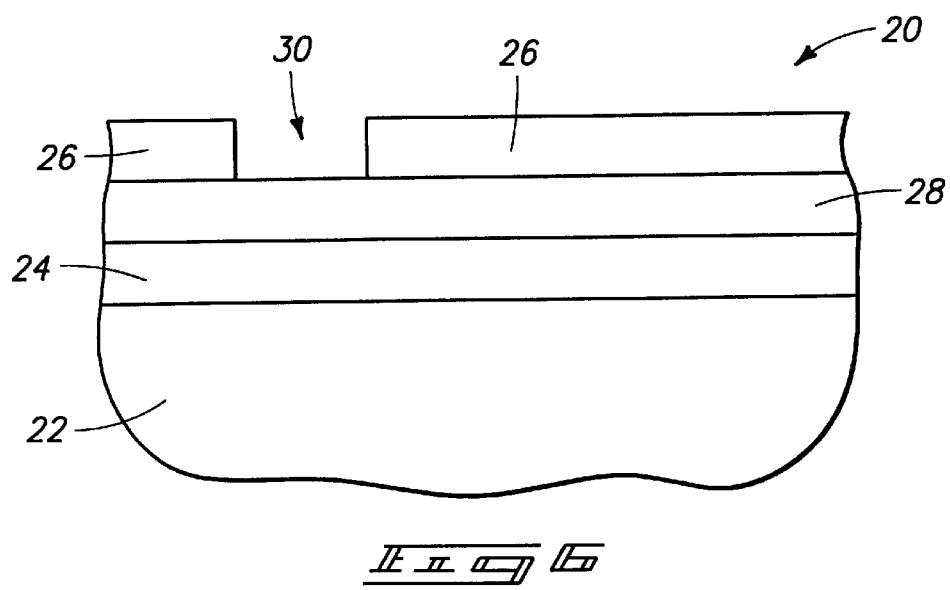
FIG. 6 is a view of the FIG. 5 wafer fragment at a processing step subsequent to that shown in FIG. 5.

Referring to FIG. 6, photoresist layer 26 is patterned by exposure to light. During such patterning, light passes through somewhat transparent layer 28 and is absorbed by antireflective material layer 24. Patterning of layer 26 forms an opening 30 extending through photoresist layer 26.

Figure 7:
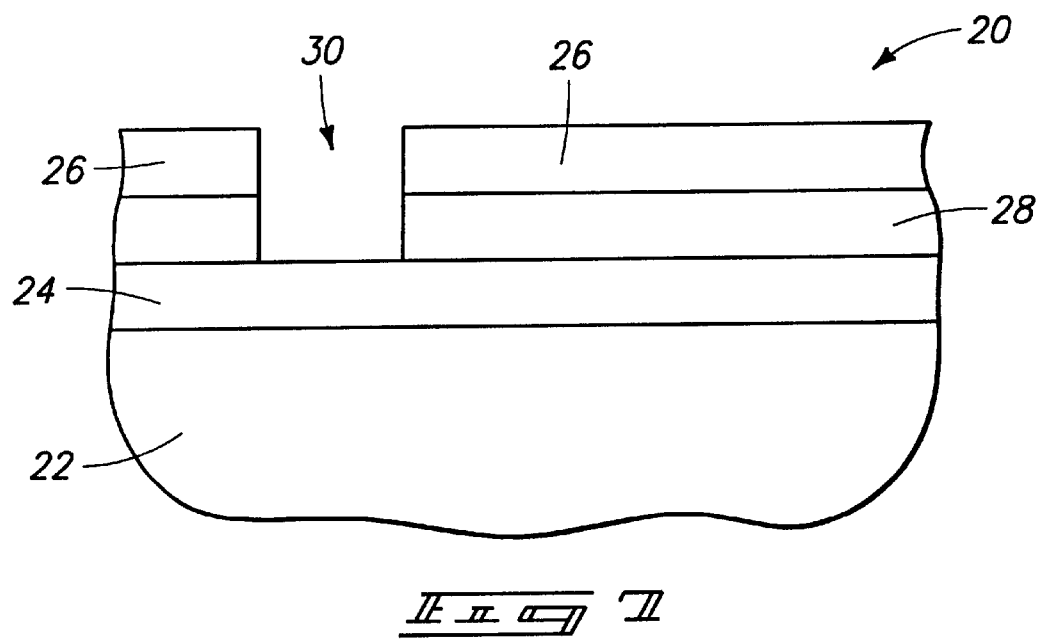
FIG. 7 is a view of the FIG. 5 wafer fragment at a processing step subsequent to that shown in FIG. 6.

Referring to FIG. 7, opening 30 is extended into intervening layer 28. In the shown embodiment, antireflective material 24 functions as an etch stop to define a bottom of extended opening 30. A material 24 consisting essentially of boron nitride can function as an etch stop during a wet etch, as boron nitride is found to be substantially resistant to wet etching conditions. Accordingly, if intervening layer comprises, for example, silicon dioxide, and antireflective material 24 consists essentially of boron nitride, the silicon dioxide can be removed by wet etching conditions to form the structure shown in FIG. 7 (i.e., a structure wherein opening 30 extends to about an upper surface of boron nitride material 24). It is noted that in other embodiments (not shown) different etching conditions can be utilized to extend opening 30 through antireflective material 24 and into substrate 22. Such different etching conditions can comprise, for example, the dry etching conditions described above with reference to FIG. 3.

Figure 8:
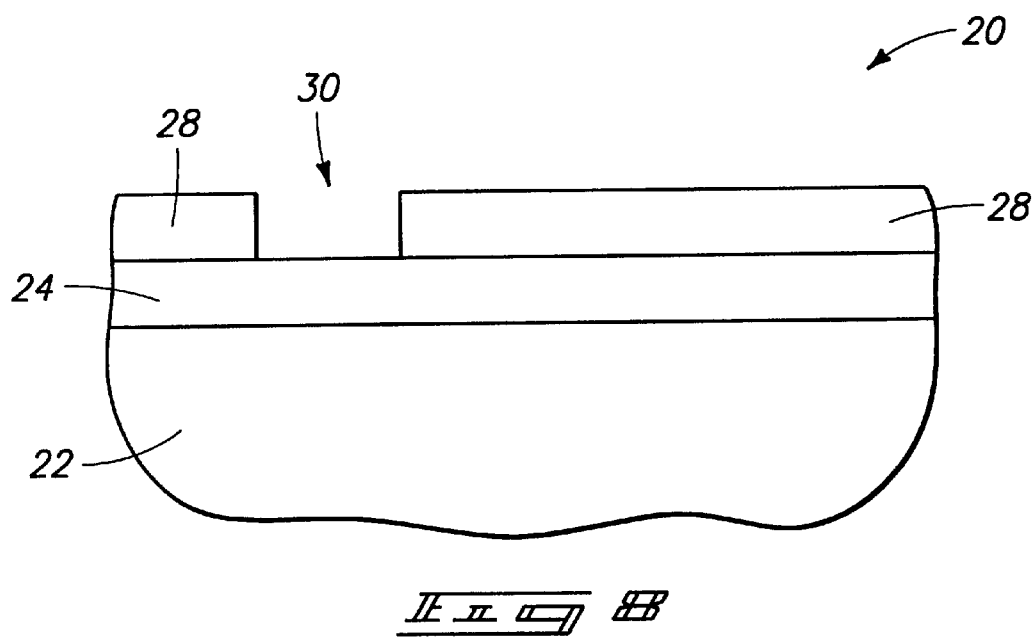
FIG. 8 is a view of the FIG. 5 wafer fragment at a processing step subsequent to that shown in FIG. 7.

Referring to FIG. 8, photoresist layer 26 (FIG. 7) is removed. In the shown embodiment, photoresist layer 26 is removed selectively relative to a boron nitride material of layer 24 such that layer 24 remains within opening 30. Such selective removal can be accomplished by, for example, a piranha etch. In other embodiments (not shown), photoresist layer 26 can be removed by an etch utilizing $CF_4$ and $O_2$ to also remove a portion of a boron nitride material 24 from within opening 30.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
   providing a substrate;
   forming a first layer of antireflective material over said substrate by chemical vapor deposition utilizing $NH_3$ in combination with tetraethylborate, the first layer having a thickness of about 100 to about 4,000 Angstroms and comprising boron and nitrogen;
   forming a photoresist on said first layer; and
   exposing one or more portions of the photoresist to light to pattern the photoresist.

2. The method of claim 1 wherein the first layer comprises more than 50% boron nitride, by weight.

3. The method of claim 1 further comprising:
   after the exposing, removing the photoresist and the first layer from over the substrate with $CF_4$ and $O_2$.

4. The method of claim 1 wherein the first layer consists essentially of boron nitride and further comprising:
   after the exposing, removing the photoresist and the first layer from over the substrate in a single etch.

5. The method of claim 4 wherein an amount of photoresist and boron nitride is present over the substrate prior to said single etch, and wherein said single etch removes substantially all of the amount of photoresist and boron nitride from over the substrate.

6. The method of claim 4 wherein the single etch comprises etching with $CF_4$ and $O_2$.

7. A semiconductor processing method comprising:
   forming an antireflective coating layer over a substrate by chemical vapor deposition utilizing $NH_3$ in combination with tetraethylborate, the layer having a thickness of about 100 to about 4,000 Angstroms and comprising boron nitride;
   forming a photoresist on the layer comprising boron nitride; and
   selectively exposing some of the photoresist to light to pattern the photoresist.

8. The method of claim 7 further comprising forming the layer comprising boron nitride by chemical vapor deposition at a temperature of less than or equal to about 400° C.

9. The method of claim 7 further comprising forming the layer comprising boron nitride without utilizing a plasma.

10. The method of claim 7 wherein the layer comprising boron nitride consists essentially of boron nitride.

11. The method of claim 7 further comprising:
    after the exposing, removing the photoresist from over the substrate.

12. The method of claim 7 further comprising:
    after the exposing, removing the photoresist and the layer comprising boron nitride from over the substrate.

13. The method of claim 7 further comprising:
    after the exposing, removing the photoresist and the layer comprising boron nitride from over the substrate with a common etchant.

14. The method of claim 7 further comprising:
    after the exposing, removing the photoresist and the layer comprising boron nitride from over the substrate with $CF_4$ and $O_2$.

15. The method of claim 7 wherein the exposing comprises exposing the photoresist to light having a wavelength of from about 200 nanometers to about 400 nanometers.

16. The method of claim 7 wherein the layer comprising boron nitride is formed to a thickness of about 300 Angstroms.

17. A semiconductor processing method comprising:
    forming an antireflective coating layer comprising boron nitride over a substrate;
    forming a layer of photoresist on the layer comprising boron nitride;
    exposing portions of the photoresist to light while leaving other portions of the photoresist unexposed, some light passing through the photoresist during the exposing;
    absorbing greater than 97% of light passing through the photoresist with the antireflective coating layer comprising boron nitride;
    selectively removing either the exposed or unexposed portions of the photoresist while leaving the other of the exposed and unexposed portions over the substrate to pattern the photoresist; and
    extending a photoresist opening through the antireflective coating layer and into the substrate to have co-linear sidewalls in the photoresist, antireflective coating layer, and substrate.

18. The method of claim 17 wherein the antireflective coating layer consists essentially of boron nitride.

19. The method of claim 17 further comprising:
    removing patterned photoresist and the antireflective coating layer from over the substrate.

20. The method of claim 17 further comprising:
    removing patterned photoresist and the antireflective coating layer from over the substrate with $CF_4$ and $O_2$.

21. The method of claim 17 wherein the exposing comprises exposing the photoresist to light having a wavelength of from about 200 nanometers to about 400 nanometers.

22. The method of claim 17 wherein the antireflective coating layer is formed to a thickness of about 100 to about 4,000 Angstroms.

* * * * *